United States Patent
Kim et al.

(10) Patent No.: US 10,930,867 B2
(45) Date of Patent: Feb. 23, 2021

(54) DISPLAY DEVICE

(71) Applicant: SAMSUNG DISPLAY CO., LTD., Yongin-si (KR)

(72) Inventors: Tae Woo Kim, Seoul (KR); Seung-Hwan Cho, Yongin-si (KR); Jong Hyun Choi, Seoul (KR); Sang Hoon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/815,117

(22) Filed: Mar. 11, 2020

(65) Prior Publication Data

US 2020/0313102 A1    Oct. 1, 2020

(30) Foreign Application Priority Data

Mar. 27, 2019    (KR) .......................... 10-2019-0034936

(51) Int. Cl.
*H01L 51/00*    (2006.01)
*H01L 27/32*    (2006.01)
*H01L 51/52*    (2006.01)

(52) U.S. Cl.
CPC ...... *H01L 51/0096* (2013.01); *H01L 27/3258* (2013.01); *H01L 27/3276* (2013.01); *H01L 51/5253* (2013.01)

(58) Field of Classification Search
CPC .................................................. H01L 51/0096
See application file for complete search history.

(56) References Cited

U.S. PATENT DOCUMENTS

| 9,997,738 | B2 | 6/2018 | Choi et al. |
| 10,205,122 | B2 | 2/2019 | Choi et al. |
| 2017/0110532 | A1* | 4/2017 | Kim .................... H01L 51/0096 |
| 2017/0141172 | A1* | 5/2017 | Cho .................... H01L 27/3246 |
| 2019/0157614 | A1 | 5/2019 | Choi et al. |

FOREIGN PATENT DOCUMENTS

| KR | 10-2017-0015632 | 2/2017 |
| KR | 10-2017-0059864 | 5/2017 |
| KR | 10-2017-0066767 | 6/2017 |
| KR | 10-2017-0096646 | 8/2017 |
| KR | 10-2017-0117291 | 10/2017 |

\* cited by examiner

*Primary Examiner* — Moazzam Hossain
*Assistant Examiner* — Mohammad A Rahman
(74) *Attorney, Agent, or Firm* — F. Chau & Associates, LLC

(57) ABSTRACT

According to an embodiment of the present invention, a display device includes: a substrate including a through-hole, a peripheral area surrounding the through-hole, a wiring area surrounding the peripheral area, and a display area surrounding the wiring area; a gate insulating layer disposed on the substrate; a gate wire disposed in the wiring area and on the gate insulating layer; an interlayer insulating layer disposed on the gate wire; a data wire disposed in the wiring area and on the interlayer insulating layer; a middle insulating layer disposed on the data wire; and a first main insulating dam disposed in the wiring area and on the middle insulating layer, wherein the first main insulating dam includes an organic material, and wherein a width of a lower surface of the first main insulating dam is narrower than a width of an upper surface of the first main insulating dam.

20 Claims, 7 Drawing Sheets

DISPLAY DEVICE

CROSS-REFERENCE TO RELATED APPLICATION

This application claims priority under 35 U.S.C. § 119 to Korean Patent Application No. 10-2019-0034936 filed in the Korean Intellectual Property Office on Mar. 27, 2019, the disclosure of which is incorporated by reference herein in its entirety.

TECHNICAL FIELD

This present invention relates to a display device, and more particularly to a display device including a through-hole.

DISCUSSION OF THE RELATED ART

Recently, as various portable electronic devices include a camera function, an instance in which an electronic device has the camera function built in has increased at a rapid rate compared to an instance in which a camera is separately carried.

In the conventional art, because the camera, a flash, a speaker, a photosensor, and the like are provided outside of an image display area of the electronic device, there is a tendency for the image display area, an area in which an image is displayed, to be decreased.

SUMMARY

According to an embodiment of the present invention, a display device includes: a substrate including a through-hole, a peripheral area surrounding the through-hole, a wiring area surrounding the peripheral area, and a display area surrounding the wiring area; a gate insulating layer disposed on the substrate; a gate wire disposed in the wiring area and on the gate insulating layer; an interlayer insulating layer disposed on the gate wire; a data wire disposed in the wiring area and on the interlayer insulating layer; a middle insulating layer disposed on the data wire; and a first main insulating dam disposed in the wiring area and on the middle insulating layer, wherein the first main insulating dam includes an organic material, and wherein a width of a lower surface of the first main insulating dam is narrower than a width of an upper surface of the first main insulating dam.

In an embodiment of the present invention, the display device further includes: an emission layer disposed on the substrate; and a cathode disposed on the emission layer, wherein the emission layer and the cathode are disposed in the peripheral area and the wiring area, and the emission layer and the cathode are separated from each other at a disconnection point based on the first main insulating dam.

In an embodiment of the present invention, the display device further includes: an encapsulation layer disposed on the cathode, wherein the encapsulation layer includes an inorganic encapsulation layer and an organic encapsulation layer.

In an embodiment of the present invention, the inorganic encapsulation layer is disposed on the middle insulating layer at the disconnection point.

In an embodiment of the present invention, the display device further includes: a first sub-insulating dam disposed in the peripheral area and disposed on the middle insulating layer, wherein the first sub-insulating dam includes a plurally of organic layers.

In an embodiment of the present invention, the plurality of organic layers include: a planarization layer disposed on the middle insulating layer; a partition disposed on the planarization layer; and a spacer disposed on the partition.

In an embodiment of the present invention, the display device further includes: a second sub-insulating dam disposed in the wiring area and on the middle insulating layer, wherein the second sub-insulating dam includes the plurality of organic layers.

In an embodiment of the present invention, the first main insulating dam is disposed on a same layer as one of the planarization layer, the partition, or the spacer.

In an embodiment of the present invention, the display device further includes: at least one second main insulating dam disposed in the peripheral area.

In an embodiment of the present invention, the through-hole is formed to penetrate the substrate, the gate insulating layer, the interlayer insulating layer, and the middle insulating layer.

According to an embodiment of the present invention, a display device includes: a substrate including a through-hole, a first non-display area surrounding the through-hole, and a display area surrounding the first non-display area; a gate insulating layer disposed on the substrate; a gate wire disposed in the first non-display area and on the gate insulating layer; an interlayer insulating layer disposed on the gate wire; a data wire disposed in the first non-display area and on the interlayer insulating layer; a middle insulating layer disposed on the data wire; an emission layer disposed on the substrate; and an encapsulation layer disposed on the emission layer and on the substrate, wherein the encapsulation layer includes an inorganic encapsulation layer and an organic encapsulation layer, the emission layer includes an opening formed in the first non-display area, and the middle insulating layer is in direct contact with the inorganic encapsulation layer in the opening.

In an embodiment of the present invention, the display device further includes: a cathode disposed between the emission layer and the inorganic encapsulation layer, wherein the cathode includes an opening formed in the first non-display area.

In an embodiment of the present invention, the first non-display area includes a peripheral area surrounding the through-hole and a wiring area surrounding the peripheral area, and wherein the gate wire and the data wire are disposed in the wiring area.

In an embodiment of the present invention, the display device further includes: a sub-insulating dam disposed in the peripheral area and on the middle insulating layer.

In an embodiment of the present invention, the sub-insulating dam includes a plurality of organic layers, and the plurality of organic layers include: a planarization layer disposed on the middle insulating layer; a partition disposed on the planarization layer; and a spacer disposed on the partition.

According to an embodiment of the present invention, a display device includes: a substrate including a through-hole, a peripheral area surrounding the through-hole, and a wiring area surrounding the peripheral area; a gate insulating layer disposed on the substrate; a gate wire disposed in the wiring area and on the gate insulating layer; an interlayer insulating layer disposed on the gate wire; a data wire disposed in the wiring area and on the interlayer insulating layer; a middle insulating layer disposed on the data wire; an organic layer disposed on the middle insulating layer; and a first reverse insulating dams disposed in the wiring area and on the organic layer, wherein the first reverse insulating dam has a tapered shape.

In an embodiment of the present invention, the display device further includes: a second reverse insulating dam disposed on the middle insulating layer; an emission layer disposed on the substrate; and a cathode disposed on the emission layer, wherein the emission layer and the cathode are separated from each other at a first disconnection point based on the first reverse insulating dam.

In an embodiment of the present invention, the display device further includes: an encapsulation layer disposed on the cathode, wherein the encapsulation layer includes an inorganic encapsulation layer and an organic encapsulation layer.

In an embodiment of the present invention, the inorganic encapsulation layer overlaps the first disconnection point.

In an embodiment of the present invention, the display device further includes a second reverse insulating dam disposed in the peripheral area.

DETAILED DESCRIPTION OF THE EMBODIMENTS

Figure 1:
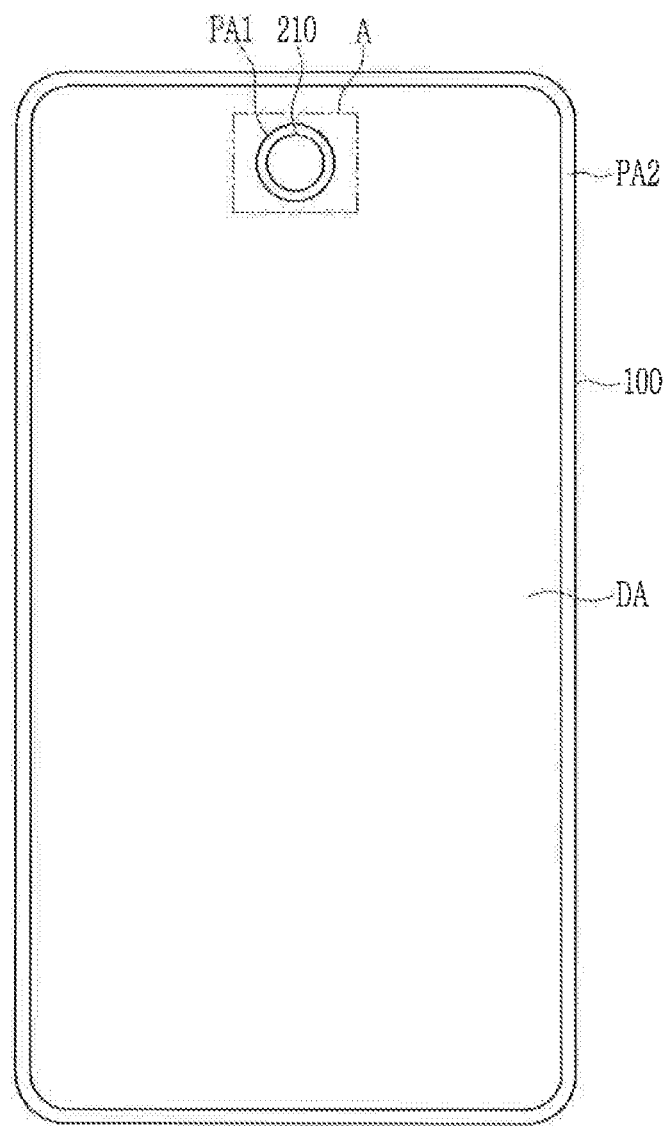
FIG. 1 is a schematic view of a display device according to an embodiment of the present invention.

The present invention will be described more fully hereinafter with reference to the accompanying drawings. It is to be understood that the described embodiments of the present invention may be modified in various different ways without departing from the spirit or scope of the present invention.

Like reference numerals may denote like elements throughout the specification, and thus repetitive descriptions may be omitted.

Further, in the drawings, a size and thickness of each element may be exaggerated for clarity, and the present invention is not limited thereto.

It will be understood that when an element such as a layer, film, area, or substrate is referred to as being "on" another element, it can be directly on the other element or intervening elements may also be present. In addition, when an element is referred to as being "directly on" another element, there are no intervening elements present.

Further, throughout the specification, the phrase "on a plane" may mean viewing a target portion from the top, and the phrase "on a cross-section" may mean viewing a cross-section formed by vertically cutting a target portion from the side.

Now, a plan view of a display panel included in a display device according to an embodiment of the present invention is described with reference to FIG. 1.

FIG. 1 is a schematic view of a display device according to an embodiment of the present invention.

A substrate 100 included in a display panel of a display device according to an embodiment of the present invention includes a display area DA, a through-hole 210, a first non-display area PA1, and a second non-display area PA2.

The display area DA is an area where a plurality of pixels are arranged, thereby being capable of displaying an image. One pixel includes a pixel circuit and an organic light emitting element (OLED) that receives a current from the pixel circuit to emit light.

The through-hole 210 is disposed in the display area DA. For example, the through-hole 210 may be formed through the substrate 100 and a plurality of insulating layers. The plurality of insulating layers are described in detail with reference to FIG. 2. At least one camera, flash, photosensor, or the like may be disposed in the through-hole 210. The camera, flash, photosensor, etc. may be disposed in conjunction with a penetrating coupling member disposed within the through-hole 210. In FIG. 1, the through-hole 210 is circularly formed at a central area of an upper portion of the display area DA, but the position, the shape, and the number of through-holes are not limited. For example, the through-hole 210 can have various shapes such as a polygonal shape, such as a quadrangular shape, or an elliptical shape.

The non-display area includes the first non-display area PA1 and the second non-display area PA2. The first non-display area PA1 is an area at least partially surrounding the perimeter of the through-hole 210. The first non-display area PA1 is an area between the through-hole 210 and the adjacent display area DA, which is the area at least partially surrounded by the second non-display area PA2. In the first non-display area PA1, a plurality of gate wires GL and a plurality of data wires DL for transmitting signals to the pixel are disposed. Next, the plurality of gate wires GL and data wires DL disposed in the first non-display area PA1 are described with reference to FIG. 2.

The second non-display area PA2 is the area at least partially surrounding an outer periphery of the display area DA. The second non-display area PA2 is a distinct area that is separated from the first non-display area PA1. A gate driver and a data driver for respectively transmitting signals to a plurality of pixels may be disposed in the second non-display area PA2. The gate driver is a part that applies the gate signal, and may be disposed on one side or both sides facing each other in the horizontal direction (e.g., a widthwise direction) with respect to the display area DA. The data driver is a part to which the data signal is applied, and may be disposed on one side or both sides facing each other in the vertical direction (e.g., a lengthwise direction) with respect to the display area DA.

Hereinafter, the through-hole 210 and the first non-display area PA1 are described in detail with reference to FIG. 2.

Figure 2:
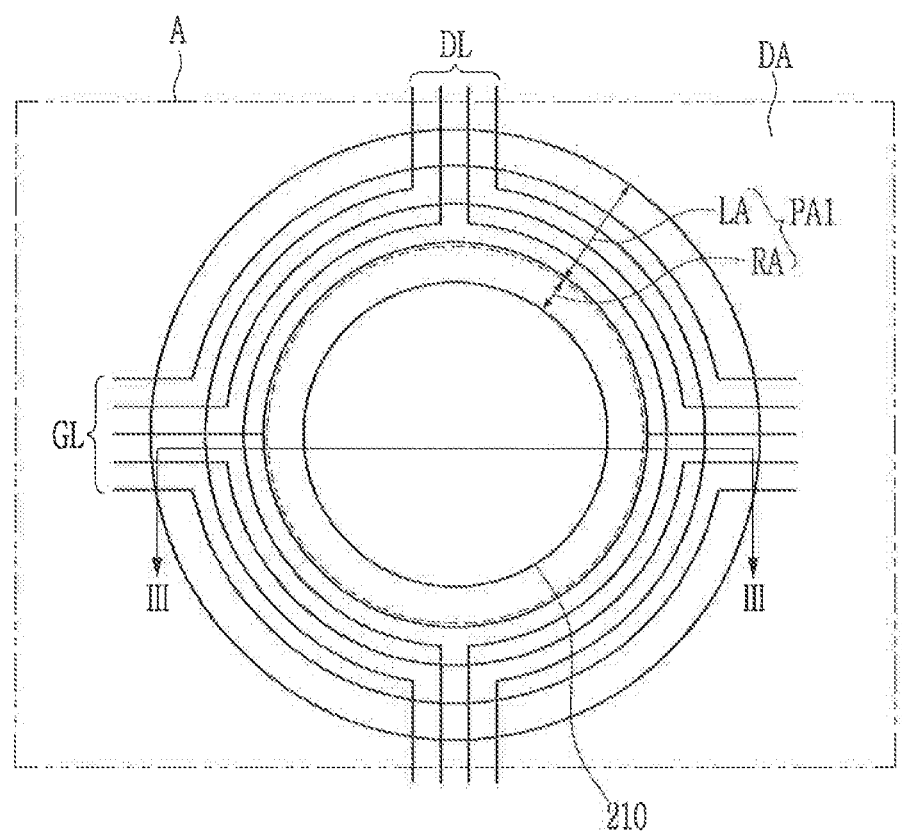
FIG. 2 is a view of an area A of FIG. 1.

FIG. 2 shows an area A of FIG. 1.

The area A of FIG. 2 includes the through-hole 210, the first non-display area PA1, and the part of the display area DA.

The first non-display area PA1 includes a peripheral area RA and a wiring area LA.

The peripheral area RA is the inner area of the first non-display area PA1 surrounding the perimeter of the through-hole 210. The gate wire GL or the data wire DL are not disposed in the peripheral area RA. The peripheral area RA is the area to prevent the wires from being damaged during the laser irradiation to form the through-hole 210, so it is desirable to keep the minimum width constant.

The wiring area LA is the outer (e.g., remaining) area of the first non-display area PA1 surrounding the peripheral area RA. The plurality of gate wires GL and the plurality of data wires DL are disposed in the wiring area LA.

The gate wire GL and the data wire DL have a semicircular structure around the through-hole 210 and bypass the through-hole 210. A plurality of gate wires GL extend in the horizontal direction along the perimeter of the through-hole 210. Here, a plurality of gate wires GL may include scan lines, emission control lines, initialization voltage lines, etc. according to supplied signals. A plurality of data wires DL extend in the vertical direction along the perimeter of the through-hole 210. A plurality of data wires DL may be include driving voltage lines and driving low voltage lines according to the supplied signal. According to an embodiment of the present invention, the voltage lines of a plurality of gate wires GL and a plurality of data wires DL may be changed. For example, gate wire GL and the data wire DL may be disposed on different layers with the insulating layer in therebetween.

In addition, the peripheral area RA and the wiring area LA surrounding the through-hole 210 are described with reference to FIG. 3.

Figure 3:
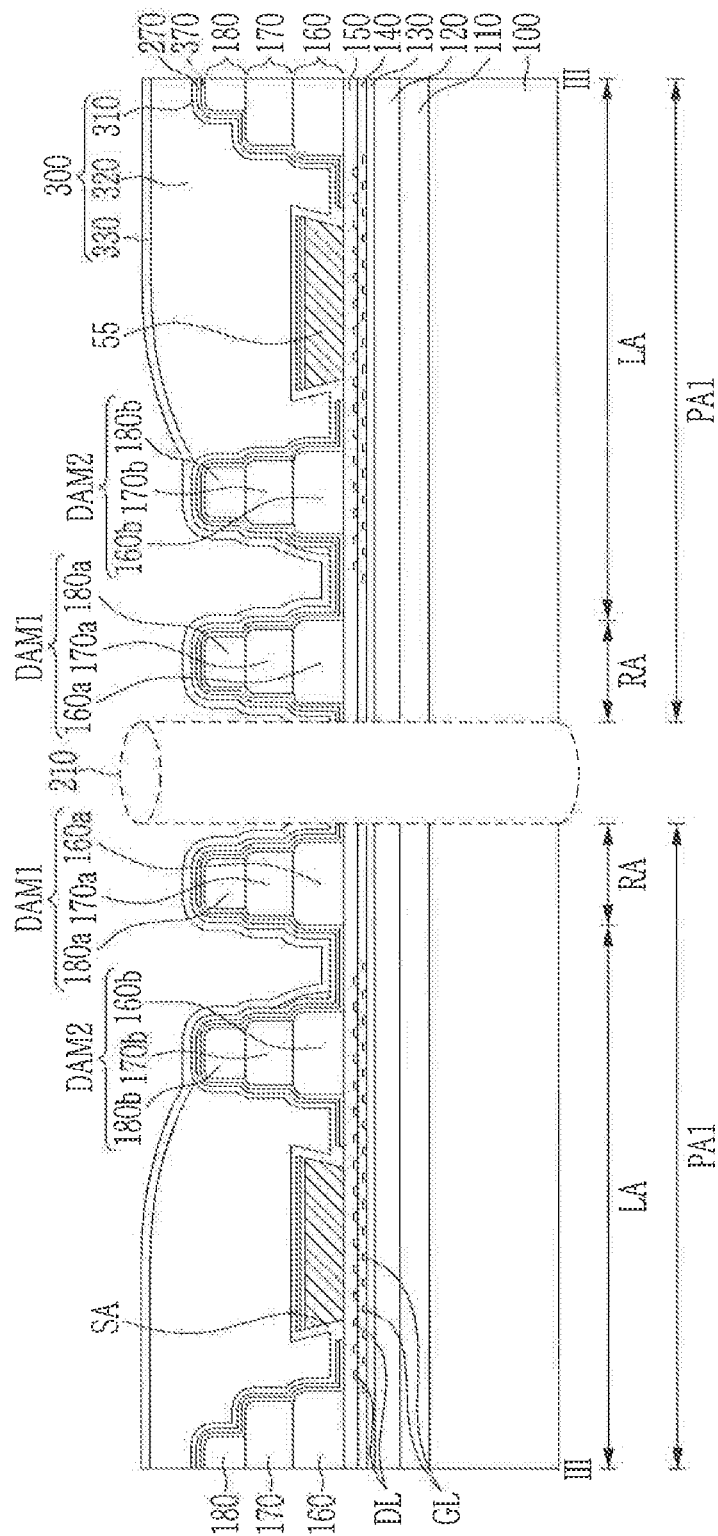
FIG. 3 is a cross-sectional view of a display device taken along a line III-III of FIG. 2 according to an embodiment of the present invention.

FIG. 3 is a cross-sectional view taken along a line III-III of FIG. 2.

Referring to FIG. 3, the organic light emitting device, according to an embodiment of the present invention, includes a substrate 100, a barrier layer 110, a buffer layer 120, a gate wire layer, a gate insulating layer 130, a data wire layer, an interlayer insulating layer 140, a middle insulating layer 150, an emission layer 370, a cathode 270, a planarization layer 160, a partition 170, a spacer 180, and an encapsulation layer 300.

The substrate 100 may be made of a material such as glass, metal, or an organic material. According to an embodiment of the present invention, the substrate 100 is made of a flexible polyimide PI. The substrate 100 includes a through-hole 210. Here, the through-hole 210 penetrates the plurality of layers disposed on the substrate 100 as well as the substrate 100, including the barrier layer 110, the buffer layer 120, the gate insulating layer 130, the interlayer insulating layer 140, the emission layer 370, the cathode 270, the encapsulation layer 300, etc. described later.

The barrier layer 110 is disposed on the substrate 100, and the buffer layer 120 is disposed on the barrier layer 110. The barrier layer 110 and the buffer layer 120 may be made of, for example, a silicon oxide (SiOx). A semiconductor layer may be disposed on the buffer layer 120. On the substrate 100, one of the barrier layer 110 or the buffer layer 120 may be omitted.

The gate insulating layer 130 is disposed on the buffer layer 120. The gate insulating layer 130 may be made of an inorganic material such as a silicon oxide (SiOx), a silicon nitride (SiNx), or the like. The gate insulating layer 130 may be disposed to cover the semiconductor layer.

The gate wire layer is disposed on the gate insulating layer 130. The gate wire layer includes a plurality of gate wires GL, and the plurality of gate wires GL include scan lines to which scan signals are applied, emission control lines to which emission control signals are applied, and initialization voltage lines to which initialization voltages are applied.

The interlayer insulating layer 140 is disposed on the gate wire layer. The interlayer insulating layer 140 may be made of the inorganic material such as a silicon oxide (SiOx) or a silicon nitride (SiNx).

The data wire layer is disposed on the interlayer insulating layer 140. The data wire layer includes a plurality of data wires DL, and the plurality of data wires DL include data lines to which data voltages are applied, driving voltage lines to which driving voltages are applied, driving low voltage lines to which driving low voltages are applied, etc. In addition, in the data wire layer, a source electrode (hereinafter, 156 of FIG. 6) or a drain electrode (hereinafter, 155 of FIG. 6) of the thin film transistor may be disposed. According to an embodiment of the present invention, the data wire layer may include a first data wire layer and a second data wire layer. The first data wire layer may be disposed on the interlayer insulating layer 140, and the second data wire layer may be disposed on the middle insulating layer 150, described below.

The middle insulating layer 150 is disposed on the data wire layer. The middle insulating layer 150 may be made of an inorganic material. The middle insulating layer 150 may be directly contact with the encapsulation layer 300 described later, thereby preventing moisture from penetrating into the organic light emitting element.

The planarization layer 160, the partition 170, the spacer 180, and the like, which are each made of an organic material, are disposed on the middle insulating layer 150. In FIG. 3, the planarization layer 160, the partition 170, and the spacer 180 are sequentially disposed on both edges of the wiring area LA. The planarization layer 160, the partition 170, and the spacer 180, which are shown only partially on both edges, are portions extending from the wiring area LA to the display area DA, and are described in detail in the cross-sectional view of the display area DA shown in FIG. 6 and FIG. 7.

In FIG. 3, except for the plurality of organic material layers of both edges of the wiring area LA, in the wiring area LA and the peripheral area RA, a first sub-insulating dam DAM1, a second sub-insulating dam DAM2, and a main insulating dam 55, which are made of the organic material, are disposed on the middle insulating layer 150. Here, the first sub-insulating dam DAM1 and the second sub-insulating dam DAM2 provide steps, thereby preventing moisture from penetrating from the through-hole 210 into the organic light emitting element.

The first sub-insulating dam DAM1 is disposed in the peripheral area RA. The first sub-insulating dam DAM1 includes a first planarization part 160a, a first partition part 170a, and a first spacer part 180a. The first planarization part 160a is disposed on the middle insulating layer 150. In addition, the first partition part 170a is disposed on the first planarization part 160a, and the first spacer part 180a is disposed on the first partition part 170a. The first planarization part 160a may be disposed on the same layer as the planarization layer 160. In addition, the first partition part 170a may be disposed on the same layer as the partition 170, and the first spacer part 180a may be disposed on the same layer as the spacer 180. According to an embodiment of the present invention, the first sub-insulating dam DAM1 may include the first partition part 170a and the first spacer part 160a, the first planarization part 160a and the first spacer part 180a, or the first planarization part 160a and the first partition part 170a.

The second sub-insulating dams DAM2 is disposed in the wiring area LA. The second sub-insulating dam DAM2 includes a second planarization part 160b, a second partition part 170b, and a second spacer part 180b. The second planarization part 160b may be disposed on the same layer as the first planarization part 160a. In addition, the second partition part 170b may be disposed on the same layer as the first partition part 170a, and the second spacer part 180b may be disposed on the same layer as the first spacer part 180a. According to an embodiment of the present invention, the second sub-insulating dam DAM2 may include the second partition part 170b and the second spacer part 180b. As a addition, according to an embodiment of the present invention, in the wiring area LA, a plurality of insulation dams may be formed on the same layer as the organic material layer of one of the planarization layer 160, the partition 170, or the spacer 180. According to an embodiment of the present invention, the spacer 180 may be formed when the partition 170 is formed.

The main insulating dam 55 is disposed in the wiring area LA. The main insulating dam 55 in the wiring area LA is referred to as a first insulating dam. The main insulating dam 55 disconnects the emission layers 370 and disconnects the cathode 270, extending in the wiring area LA, thereby preventing moisture inflowed from the through-hole 210 from being transmitted to the organic light emitting element OLED of the display area DA. For example, in an embodiment of the present invention, the main insulating dam 55 may separate the emission layer 370 to form a disconnection in the emission layer 370 to further prevent the inflow of moisture from the through-hole 210 to the organic light emitting element OLED. For example, the disconnection part SA, formed in the emission layer 370 and the cathode 270 by the main insulating dam 55, disposed in the wiring area LA may prevent moisture from penetrating into the organic emission layer located in the display area DA. The main insulating dam 55 may be formed together with one of the planarization layer 160, the partition 170, or the spacer 180, and may be formed of a single layer or a plurality of organic layers. For example, the main insulating dam 55 is implemented with a shape of which a width of the lower surface is narrower a width of the upper surface. For example, a reverse tapered shape, an inverted trapezoid shape, a "T" shape, an under-cut shape, or the like may be formed. According to an embodiment of the present invention, the main insulating dam 55 may be formed as a plurality of dams of different sized shapes and/or different shapes.

The emission layer 370 is disposed on the main insulating dam 55, the first sub-insulating dam DAM1, and the second sub-insulating dams DAM2. The cathode 270 is disposed above the emission layer 370. Here, the emission layers 370 and the cathode 270 may form the organic light emitting element (OLED) together with an anode to be described later (hereinafter, 191 of FIG. 6,). The emission layer 370 and the cathode 270 are formed over the substrate 100 to cover the main insulating dam 55 disposed on the middle insulating layer 150. In addition, the emission layer 370 and the cathode 270 are formed over the first sub-insulating dam DAM1 and the second sub-insulating dams DAM2. Further, as an example, the emission layer 370 and the cathode 270 may be formed over the entire surface of the substrate. According to an embodiment of the present invention, the emission layer 370 may be formed in some areas of the substrate 100.

According to an embodiment of the present invention, the emission layer 370 and the cathode 270 are formed on the upper surface of the main insulating dam 55 and are not formed on the side surface of the main insulating dam 55 having the reverse tapered shape. The emission layer 370 and the cathode 270 include the disconnection part SA as a result of the main insulating dam 55. Thus, the main insulating dam 55 disconnects the emission layer 370 or the cathode 270 extending from the display area DA into the wiring area LA, thereby preventing moisture, inflowed from the through-hole 210, from being transmitted to the organic light emitting element OLED of the display area DA. The disconnection part SA is a part where the middle insulating layer 150 and an encapsulation layer 300 described later are in direct contact with each other. The disconnection part SA may prevent moisture ($H_2O$) from penetrating along the interface direction between the layers (e.g., a direction parallel to an upper surface of the substrate 100).

In a display device according to a comparative example, an insulating dam of a relatively large size is disposed in the peripheral area RA and the wiring area LA to form the disconnection portion of the cathode 270 or the emission layer 370, as the first non-display area PA1 is on the perimeter of the through-hole 210.

In contrast, in the display device according to an embodiment of the present invention, by forming the disconnection part SA of the cathode 270 or the emission layer 370 in the wiring area LA, the first non-display area PA1 on the perimeter of the through-hole 210 may be reduced.

The encapsulation layer 300 is disposed on the cathode 270. The encapsulation layer 300 includes a first inorganic encapsulation layer 310, an organic encapsulation layer 320, and a second inorganic encapsulation layer 330. The first inorganic encapsulation layer 310 and the second inorganic encapsulation layer 330 are formed throughout the non-display area PA1 and PA2 and the display area DA. In addition, the organic encapsulation layer 320 may be formed on a part of the display area DA and a part of the wiring area LA. For example, the organic encapsulation layer 320 might not be formed in the peripheral area RA. In a part of the wiring area LA and the peripheral area RA, the first inorganic encapsulation layer 310 and the second inorganic encapsulation layer 330 are in direct contact with each other. According to an embodiment of the present invention, a plurality of inorganic layers and organic layers may be included to prevent moisture penetration.

The first inorganic encapsulation layer 310 can directly contact the middle insulating layer 150 in the disconnection part SA to prevent the moisture, that may penetrate along the interface between the layers, from inflowing into the organic light emitting element (OLED).

Hereinafter, the display device without including the main insulating dam 55 of FIG. 3 is described with reference to FIG. 4.

Figure 4:
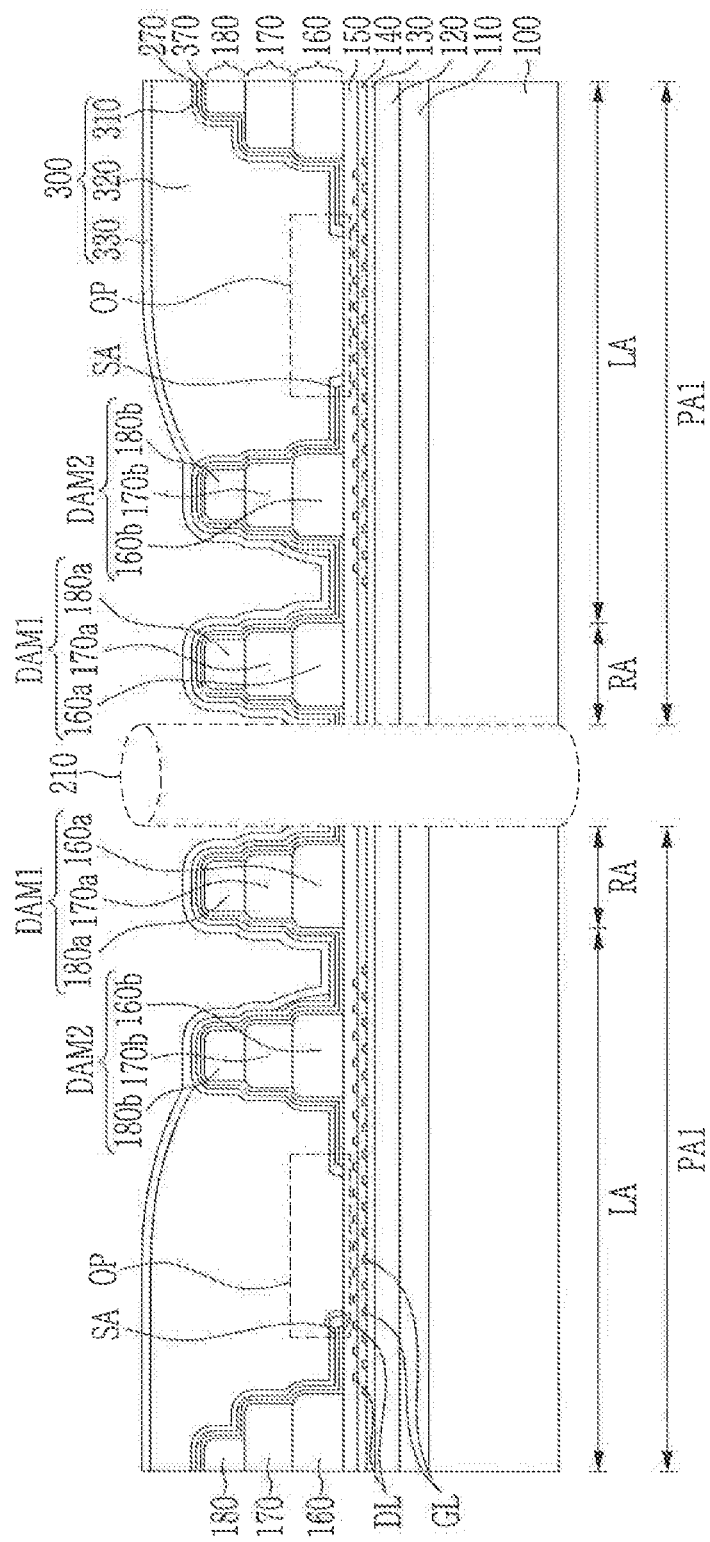
FIG. 4 is a cross-sectional view of a display device according to an embodiment of the present invention.

FIG. 4 is a cross-sectional view of a display device according to an embodiment of the present invention.

In FIG. 4, since the display device according to an embodiment of the present invention is the same as that described in FIG. 3 except for the opening OP of the emission layer 370 and the cathode 270, the differences are mainly described.

A first sub-insulating dam DAM1 and a second sub-insulating dam DAM2, which are made of organic material, are disposed on the middle insulating layer 150. Here, the first sub-insulating dam DAM1 and the second sub-insulating dam DAM2 provide steps to prevent the moisture, which is from the through-hole 210, from penetrating into the organic light emitting element (OLED).

The emission layer 370 is disposed on the first sub-insulating dam DAM1 and the second sub-insulating dam DAM2, and the cathode 270 is disposed on the emission layer 370. The emission layer 370 and the cathode 270 are formed over the substrate 100 to cover all of the first sub-insulating dam DAM1 and the second sub-insulating dam DAM2 on the middle insulating layer 150. In addition, a part of the emission layer 370 and a part of the cathode 270 disposed in the wiring area LA is disconnected by a laser irradiation process. Thus, the emission layer 370 and the cathode 270 include the opening OP. Here, both sides of the opening OP may be referred to as the disconnection part SA. The disconnection part SA is a portion in which the middle insulating layer 150 and the first inorganic encapsulation layer 310 described later directly contact each other. In the disconnection part SA formed in the wiring area LA, since the cathode 270 and the emission layer 370 are disconnected, the moisture inflowed from the through-hole 210 may not be transmitted to the organic light emitting element (OLED) in the display area DA. For example, the disconnection part SA formed in the wiring area LA may prevent moisture from being transferred to the organic emission layer 370 located in the display area DA.

In addition, the display device according to an embodiment of the present invention may reduce the first non-display area PA1 around the perimeter of the through-hole 210 by forming the disconnection part SA of the cathode 270 and/or the emission layer 370 in the wiring area LA.

Hereinafter, the display device further including a plurality of main insulating dams 55 in the peripheral area RA without including the first sub-insulating dam DAM1, unlike in FIG. 3, is described with reference to FIG. 5.

Figure 5:
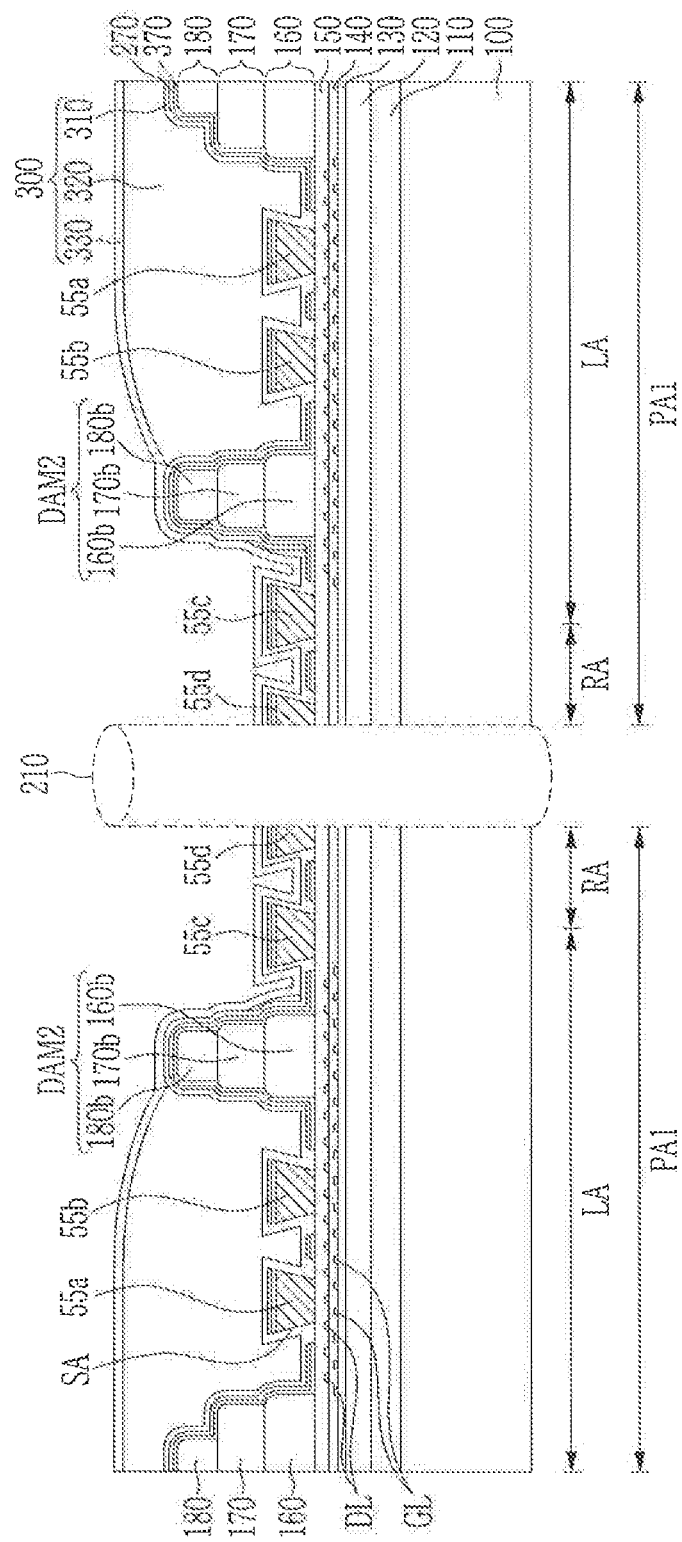
FIG. 5 is a cross-sectional view of a display device according to an embodiment of the present invention.

FIG. 5 is a cross-sectional view of a display device according to an embodiment of the present invention.

In FIG. 5, since the display device according to an embodiment of the present invention further includes a plurality of main insulating dams 55a, 55b, 55c, and 55d having a relatively small size in the peripheral area RA, and the differences, except for the same content as mentioned in FIG. 3, are mainly described.

The second sub-insulating dam DAM2 and a plurality of main insulating dams 55a, 55b, 55c, and 55d, which are made of the organic material, are disposed on the middle insulating layer 150. The second sub-insulating dams DAM2 and a plurality of main insulating dams 55a, 55b, 55c, and 55d provide steps to block the path of moisture penetration from the through-hole 210 to the organic light emitting element (OLED).

The second sub-insulating dams DAM2 is disposed in the wiring area LA and includes the second planarization part 160b, the second partition part 170b, and the second spacer part 180b. According to an embodiment of the present invention, the second sub-insulating dams DAM2 may include the second partition part 170b and the second spacer part 180b.

A plurality of main insulating dams 55a, 55b, 55c and 55d are disposed in the wiring area LA and the peripheral area RA. The main insulating dams 55c and 55d in the peripheral area RA are referred to as a second insulating dam. In FIG. 5, two main insulating dams 55a and 55b of the same size are disposed in the wiring area LA, and two main insulating dams 55c and 55d of the same size are disposed in the peripheral area RA. The main insulating dams 55a, 55b, 55c and 55d disconnect the emission layer 370 and disconnect the cathode 270 so that the moisture inflowed from the through-hole 210 may not be transmitted to the organic light emitting element OLED of the display area DA. The main insulating dams 55a, 55b, 55c, and 55d may be formed together with any one of the planarization layer 160, the partition 170, or the spacer 180, and may be formed of a single layer or a plurality of organic layers. The main insulating dams 55a, 55b, 55c, and 55d are formed with the shape of which the width of the lower surface is narrower than the width of the upper surface. For example, a reverse tapered shape, an inverted trapezoid shape, a "T" shape, an under-cut shape, or the like may be formed.

According to the embodiment of the present invention, the main insulating dams 55a, 55b, 55c, and 55d may be formed of the organic layers of different sizes and shapes.

The emission layer 370 is disposed on the main insulating dams 55a, 55b, 55c, and 55d and the second sub-insulating dams DAM2. The cathode 270 is disposed on the emission layer 370. Here, the emission layers 370 and the cathode 270 may form the organic light emitting element (OLED) together with the anode to be described later (hereinafter, 191 of FIG. 6). The emission layers 370 and the cathode 270 are formed over the substrate 100 to cover both the main insulating dams 55a, 55b, 55c, and 55d and the second sub-insulating dam DAM2 on the middle insulating layer 150. However, the emission layers 370 ans the cathode 270 are formed only on the upper surfaces of the main insulating dams 55a, 55b, 55c and 55d and are not formed on the side surfaces of the main insulating dams 55a, 55b, 55c, and 55d by the inverted tapered shape of the main insulating dams 55a, 55b, 55c, and 55d. The emission layer 370 and the cathode 270 include the disconnection part SA as a result of the main insulating dams 55a, 55b, 55c, and 55d. Therefore, the main insulating dams 55a, 55b, 55c, and 55d partially disconnect the emission layer 370 or the cathode 270 in the peripheral area RA and the wiring area LA, thereby preventing the moisture inflowed from the through-hole 210 from penetrating the organic light emitting element (OLED). In an embodiment of the present invention, the disconnection part SA is the portion in which the middle insulating layer 150 and the first inorganic encapsulation layer 310 may directly contact each other. The disconnection part SA may prevent the moisture ($H_2O$) from penetrating the organic light emitting element (OLED) in the display area DA along the interface direction between the layers.

In addition, the display device according to an embodiment of the present invention may reduce the first non-display area PA1 around the perimeter of the through-hole 210 by disposing the main insulating dam 55 of the smaller size than the first and second sub-insulating dams DAM1 and DAM2 in the peripheral area RA and the wiring area LA to form the disconnection portion of the cathode 270 or the emission layer 370.

The encapsulation layer 300 is disposed on the cathode 270. The encapsulation layer 300 includes a first inorganic encapsulation layer 310, an organic encapsulation layer 320, and a second inorganic encapsulation layer 330. The encapsulation layer 300 is the layer to cover the substrate 100 for preventing moisture from penetrating into the organic light emitting element (OLED), and may have a structure that blocks moisture penetration by including the plurality of inorganic layers and organic layers according to an embodiment.

The first inorganic encapsulation layer 310 may directly contact the middle insulating layer 150 in the disconnection part SA to prevent moisture inflow that may penetrate along the interface between the layers to the organic light emitting element (OLED).

Hereinafter, the display device including the through-hole 210, the first non-display area PA1, and the display area DA is described with reference to FIG. 6.

Figure 6:
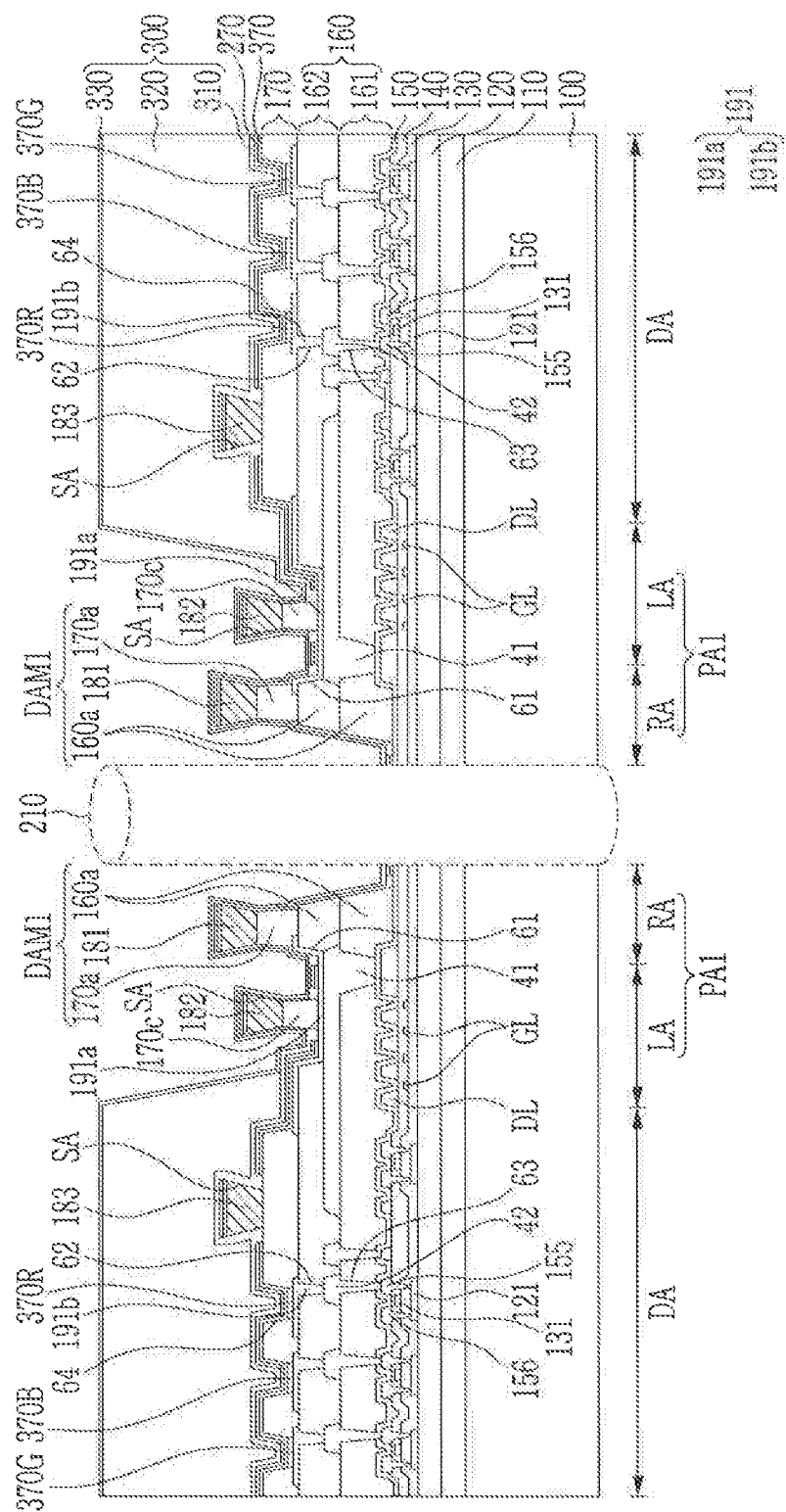
FIG. 6 is a cross-sectional view of a portion of a first non-display area and a display area in a display device according to an embodiment of the present invention.

FIG. 6 is a cross-sectional view showing a first non-display area and a part of a display area in a display device according to an embodiment of the present invention.

Referring to FIG. 6, the display device according to an embodiment of the present invention includes the barrier layer 110, the buffer layer 120, a semiconductor layer 121, the gate wire layer, the gate insulating layer 130, the data wire layer, the interlayer insulating layer 140, the middle insulating layer 150, the emission layer 370, the cathode 270, a plurality of organic layers, and the encapsulation layer 300, which are sequentially disposed on the substrate 100. The substrate 100, the barrier layer 110, the buffer layer 120, the gate insulating layer 130, the interlayer insulating layer 140, the middle insulating layer 150, the emission layer 370, the cathode 270, and the encapsulation layer 300 are formed over the peripheral area RA, the wiring area LA, and the display area DA. Here, the substrate 100, the barrier layer 110, the buffer layer 120, the gate insulating layer 130, and the interlayer insulating layer 140 are the same as described in FIG. 3, and therefore further description thereof may be omitted.

The substrate 100 includes the through-hole 210. Here, the through-hole 210 penetrates the plurality of layers disposed on the substrate 100, which include the barrier layer 110, the buffer layer 120, the gate insulating layer 130, the interlayer insulating layer 140, the emission layer 370, the cathode 270, the encapsulation layer 300, etc. described later, in addition to the substrate 100.

The barrier layer 110 is disposed on the substrate 100, and the buffer layer 120 is disposed on the barrier layer 110.

In the display area DA, a thin film transistor is disposed on the buffer layer 120. The thin film transistor includes the semiconductor layer 121, a gate electrode 131, the source electrode 156, and the drain electrode 155. The gate insulating layer 130 is disposed between the semiconductor layer 121 and the gate electrode 131. The interlayer insulating layer 140 is disposed on the gate electrode 131, and the source electrode 156 and the drain electrode 155 are disposed on the interlayer insulating layer 140. The middle insulating layer 150 is disposed over the interlayer insulating layer 140 to cover the source electrode 156 and the drain electrode 155.

The semiconductor layer 121 may include, for example, amorphous silicon, polycrystalline silicon, or an oxide semiconductor.

The gate insulating layer 130 and the interlayer insulating layer 140 may include, for example, an inorganic material including an oxide or nitride.

The gate electrode 131, the source electrode 156, and drain electrode 155 may include, for example, a low resistance metal material.

The gate electrode 131 is included in the gate wire layer, and the gate wire layer in the non-display area includes a plurality of gate wires CL.

The source electrode 156 and the drain electrode 155 are connected to the semiconductor layer 121 through a contact hole formed in the interlayer insulating layer 140. The source electrode 156 and the drain electrode 155 are included in the data wire layer, and the data wire layer in the non-display area includes a plurality of data wires DL.

The middle insulating layer 150 is disposed on the interlayer insulating layer 140 to cover the source electrode 156, drain electrode 155, and a plurality of data wires DL. The middle insulating layer 150 may be made of an inorganic material, and may include a portion in direct contact with the encapsulation layer 300 to prevent moisture from penetrating into the organic light emitting element (OLED).

The planarization layer 160 made of the organic material is disposed on the middle insulating layer 150. The planarization layer 160 is formed throughout the display area DA and the non-display area PA1 and PA2. The planarization layer 160 includes a first planarization layer 161 and a second planarization layer 162.

The first planarization layer 161 is disposed on the middle insulating layer 150.

An upper data wire layer is disposed on the first planarization layer 161. The upper data wire layer includes a plurality of upper data electrodes. Among the plurality of the upper data electrodes, a first upper data electrode 41 is electrically connected to the data wire DL, the drain electrode 155, and/or the source electrode 156 through a contact hole 63 formed in the first planarization layer 161.

The second planarization layer 162 is disposed on the first planarization layer 161 and is formed to cover the upper data wire layer including the first upper data electrode 41. The first upper data electrode 41 is disposed such that its upper surface is exposed through an opening 61 formed in the second planarization layer 162.

The anode 191 is disposed on the second planarization layer 162. The anode 191 forms the organic light emitting element (OLED) together with the emission layer 370 and the cathode 270. A first anode 191*a* is in direct contact with the upper surface of the first upper data electrode 41 through the opening 61 formed in the second planarization layer 162 to be electrically connected to each other. A second anode 191*b* is electrically connected to a second upper electrode 42 through a contact hole 62 formed in the second planarization layer 162. The second upper data electrode 42 is connected to the drain electrode 155 through the contact hole 63 formed in the first planarization layer 161. Thus, the anode 191 may be connected to the drain electrode 155 of the thin film transistor.

The partition 170 is disposed on the anode 191. The partition 170 includes an opening 64 exposing the anode 191. Red, blue, and green emission layers 370R, 370B, and 370G are disposed in the opening 64 of the partition 170 disposed in the display area DA. The red, blue, and green emission layers 370R, 370B, and 370G may include an organic light emitting material or an inorganic light emitting material. In FIG. 6, the red, blue, and green emission layers 370R, 370B, and 370G are shown, but the positions of the red, blue, and green emission layers 370R, 370B, and 370G may be varied depending on an embodiment of the present invention. In addition, the red, blue, and green emission layers 370R, 370B, and 370G may refer to some areas of the emission layer 370 formed in the display area DA among the emission layer 370.

In the first non-display area PA1, the partition 170 includes the first partition part 170*a* and a third partition part 170*c*. The first partition part 170*a* is disposed on the second planarization layer 162, and a third partition part 170*c* disposed on the anode 191*a*. The first partition part 170*a* may form one insulation dam with the first planarization part 160*a*. For example, the first planarization part 160*a* may be a part of the second planarization layer 162.

Upper spacers 181, 182, and 183 are disposed on the part of the partition 170. The upper spacers 181, 182, and 183 are disposed in the non-display area (e.g., PA1) and a portion of the display area DA. The upper spacers 181, 182, and 183 partially disconnect the emission layers 370 and partially disconnect the cathode 270 to prevent moisture, inflowed from the through-hole 210, from penetrating the organic light emitting element (OLED) in the display area DA. The upper spacers 181, 182, and 183 are realized with the shape of which the width of the lower surface is narrower than the width of the upper surface. For example, the upper spacers 181, 182, and 183 may be formed to have a reverse tapered shape, an inverted trapezoid shape, a "T" shape, an undercut shape, or the like. According to an embodiment of the present invention, the upper spacers 181, 182, and 183 may be formed in different shapes having different sizes, respectively.

In FIG. 6, the upper spacers 181, 182, and 183 includes a first upper spacer 181, a second upper spacer 182, and a third upper spacer 183 respectively disposed in the peripheral area RA, the wiring area LA, and the display area DA. The first upper spacer 181 is included in the first reverse insulating dam DAM1 in the peripheral area RA together with the first planarization part 160a and the first partition part 170a. The second upper spacer 182 includes a reverse insulating dam in the wiring area LA along with the third partition part 170c. The third upper spacer 183 may be formed of a single layer of the reverse insulating dams in the display area DA.

The emission layer 370 is disposed to cover the upper spacers 181, 182, and 183, the partition 170, the planarization layer 160, the anode 191, and the red, blue, and green emission layers 370R, 370B, and 370G. The cathode 270 is disposed on the emission layer 370. The emission layer 370 and the cathode 270 are formed to cover the surface of the substrate 100. However, the emission layers 370 and the cathode 270 are formed only on the upper surfaces of the upper spacers 181, 182, and 183 which have an inverted tapered shape, and the emission layers 370 are not formed on the sides of the upper spacers 181, 182, and 183. The emission layer 370 and the cathode 270 include a plurality of disconnection portions SA based on the upper spacers 181, 182, and 183. Thus, the upper spacer 180 disconnects the emission layer 370 or the cathode 270 extending to the display area DA to protect the display element from moisture. In an embodiment of the present invention, at the disconnection part SA, the middle insulating layer 150 and the encapsulation layer 300 may be in direct contact with each other. The disconnection part SA may prevent moisture (H2O) from penetrating along the interface direction between the layers.

An encapsulation layer 300 is disposed on the cathode 270. The encapsulation layer 300 includes the first inorganic encapsulation layer 310, the organic encapsulation layer 320, and the second inorganic encapsulation layer 330. The encapsulation layer 300 is a layer that may prevent moisture from penetrating into the organic light emitting element (OLED) layer and that covers the substrate 100. According to an embodiment of the present invention, the encapsulation layer 300 may have a structure that prevents moisture penetration by including a plurality of inorganic layers and organic layers.

The first inorganic encapsulation layer 310 may overlap the middle insulating layer 150 at the disconnection portion SA. For example, at the disconnection portion SA, the first inorganic encapsulation layer 310 may directly contact the middle insulating layer 150 to prevent moisture inflow into the organic light emitting element (OLED) that may penetrate along the interface between the layers. Therefore, the moisture is prevented from penetrating from the through-hole 210 to the organic light emitting element (OLED).

Figure 7:
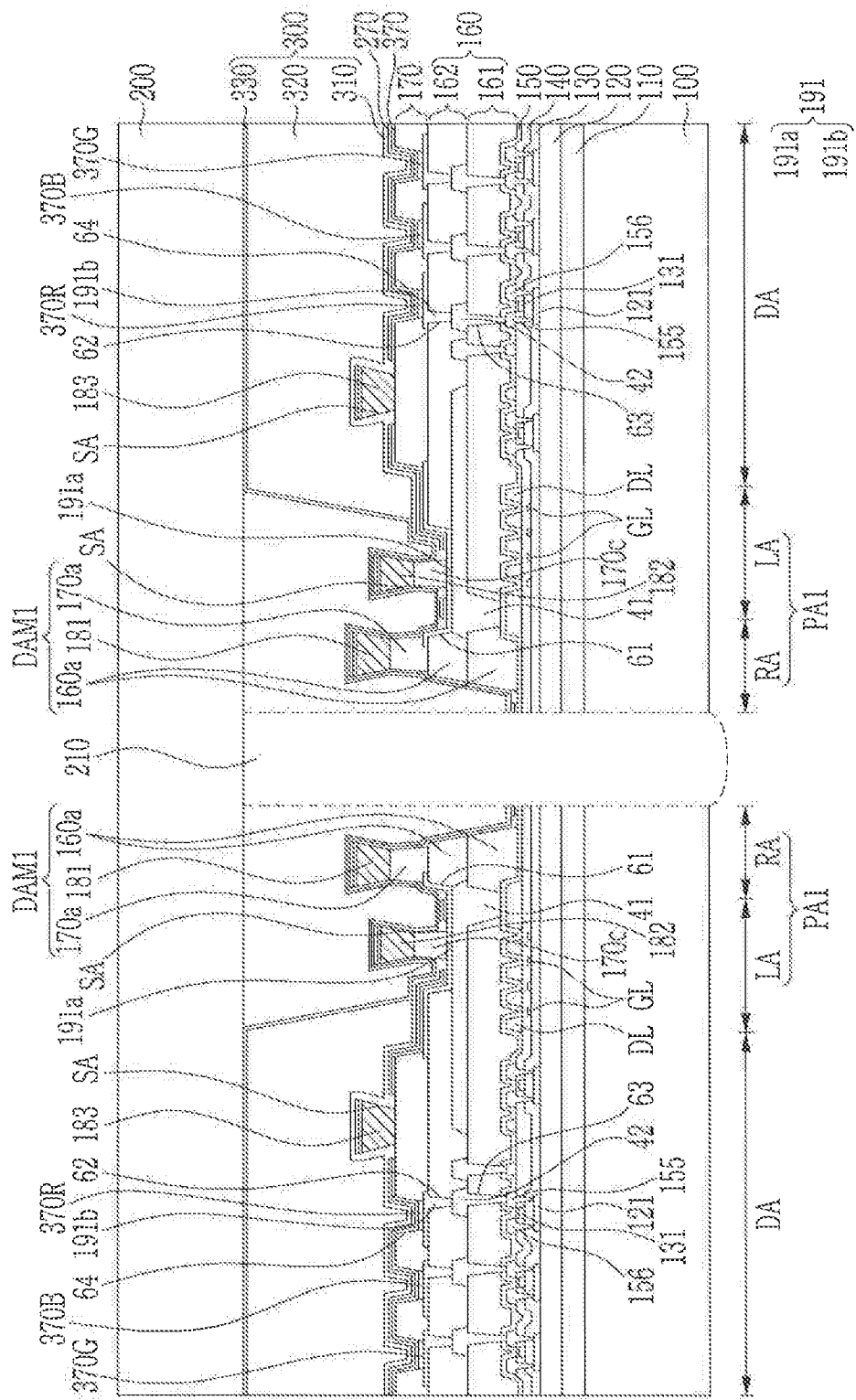
FIG. 7 is a cross-sectional view of a portion of a first non-display area and a display area including a window in a display device according to an embodiment of the present invention.

Next, the display device according to an embodiment of the present invention, in FIG. 7, further includes a window 200, unlike the display device of FIG. 6.

FIG. 7 is a cross-sectional view of a portion of a first non-display area and a display area of a display device including a window according to an embodiment of the present invention.

Referring to FIG. 7, the window 200 is disposed at the top of the display device and may protect various configurations disposed in the lower part of the display device. In addition, the window 200 is made of a transparent material to transmit the internal light generated inside the display device to the outside so that the image may be visually recognized from the outside. The window 200 is disposed on the upper surface of the second inorganic encapsulation layer 330. For example, the window 200 may be attached to second inorganic encapsulation layer 300 by an adhesive layer. Since the window 200 is formed over the upper surface of the display device, the open area of the through-hole 210 may be protected by the window 200. In addition, a light generated from a camera, a flash, a photosensor, or the like, which may be disposed in the through-hole 210, may be transmitted to the outside through the window 200.

While the present invention has been shown and described with reference to the embodiments thereof, it will be apparent to those of ordinary skill in the art that various changes in form and detail may be made thereto without departing from the spirit and scope of the present invention.

What is claimed is:

1. A display device comprising:
   a substrate including a through-hole, a peripheral area surrounding the through-hole, a wiring area surrounding the peripheral area, and a display area surrounding the wiring area;
   a gate insulating layer disposed on the substrate;
   a gate wire disposed in the wiring area and on the gate insulating layer;
   an interlayer insulating layer disposed on the gate wire;
   a data wire disposed in the wiring area and on the interlayer insulating layer;
   a middle insulating layer disposed on the data wire; and
   a first main insulating dam disposed in the wiring area and on the middle insulating layer,
   wherein the first main insulating dam includes an organic material, and wherein a width of a lower surface of the first main insulating dam is narrower than a width of an upper surface of the first main insulating dam.

2. The display device of claim 1, further comprising:
   an emission layer disposed on the substrate; and
   a cathode disposed on the emission layer,
   wherein the emission layer and the cathode are disposed in the peripheral area and the wiring area, and
   the emission layer and the cathode include a disconnection point based on the first main insulating dam.

3. The display device of claim 2, further comprising:
   an encapsulation layer disposed on the cathode,
   wherein the encapsulation layer includes an inorganic encapsulation layer and an organic encapsulation layer.

4. The display device of claim 3, wherein
   the middle insulating layer and the inorganic encapsulation layer are in direct contact at the disconnection point.

5. The display device of claim 1, further comprising:
   a first sub-insulating dams disposed in the peripheral area and disposed on the middle insulating layer,
   wherein the first sub-insulating dam includes a plurality of organic layers.

6. The display device of claim 5, wherein
   the plurality of organic layers include:
   a planarization layer disposed on the middle insulating layer;
   a partition disposed on the planarization layer; and
   a spacer disposed on the partition.

7. The display device of claim 6, further comprising
   a second sub-insulating dams disposed in the wiring area and on the middle insulating layer,
   wherein the second sub-insulating dams includes the plurality of organic layers.

8. The display device of claim 6, wherein
the first main insulating dam is disposed on a same layer as one of the planarization layer, the partition, or the spacer.

9. The display device of claim 6, further comprising
at least one second main insulating dam disposed in the peripheral area.

10. The display device of claim 1, wherein
the through-hole is formed to penetrate the substrate, the gate insulating layer, the interlayer insulating layer, and the middle insulating layer.

11. A display device comprising:
a substrate including a through-hole, a first non-display area surrounding the through-hole, and a display area surrounding the first non-display area;
a gate insulating layer disposed on the substrate;
a gate wire disposed in the first non-display area and on the gate insulating layer;
an interlayer insulating layer disposed on the gate wire;
a data wire disposed in the first non-display area and on the interlayer insulating layer;
a middle insulating layer disposed on the data wire;
an emission layer disposed on the substrate; and
an encapsulation layer disposed on the emission layer and on the substrate,
wherein the encapsulation layer includes an inorganic encapsulation layer and an organic encapsulation layer,
the emission layer includes an opening formed in the first non-display area, and
the middle insulating layer is in direct contact with the inorganic encapsulation layer in the opening.

12. The display device of claim 11, further comprising
a cathode disposed between the emission layer and the inorganic encapsulation layer,
wherein the cathode includes an opening formed in the first non-display area.

13. The display device of claim 12, wherein
the first non-display area includes a peripheral area surrounding the through-hole and a wiring area surrounding the peripheral area, and
wherein the gate wire and the data wire are disposed in the wiring area.

14. The display device of claim 13, further comprising
a sub-insulating dam disposed in the peripheral area and on the middle insulating layer.

15. The display device of claim 14, wherein
the sub-insulating dam includes a plurality of organic layers, and
the plurality of organic layers include:
a planarization layer disposed on the middle insulating layer;
a partition disposed on the planarization layer; and
a spacer disposed on the partition.

16. A display device comprising:
a substrate including a through-hole, a peripheral area surrounding the through-hole, and a wiring area surrounding the peripheral area;
a gate insulating layer disposed on the substrate;
a gate wire disposed in the wiring area and on the gate insulating layer;
an interlayer insulating layer disposed on the gate wire;
a data wire disposed in the wiring area and on the interlayer insulating layer;
a middle insulating layer disposed on the data wire;
an organic layer disposed on the middle insulating layer; and
a first reverse insulating dam disposed in the wiring area and on the organic layer,
wherein the first reverse insulating dam has a tapered shape.

17. The display device of claim 16, further comprising:
a second reverse insulating dam disposed on the middle insulating layer;
an emission layer disposed on the substrate; and
a cathode disposed on the emission layer,
wherein the emission layer and the cathode include a first disconnection point based on the first reverse insulating dams.

18. The display device of claim 17, further comprising
an encapsulation layer disposed on the cathode,
wherein the encapsulation layer includes an inorganic encapsulation layer and an organic encapsulation layer.

19. The display device of claim 18, wherein
the middle insulating layer and the inorganic encapsulation layer are in direct contact at the first disconnection point.

20. The display device of claim 16, further comprising
a second reverse insulating dams disposed in the peripheral area.

* * * * *